United States Patent
Miyazaki

(10) Patent No.: US 12,155,938 B2
(45) Date of Patent: Nov. 26, 2024

(54) ABNORMALITY DETECTION APPARATUS, ABNORMALITY DETECTION METHOD, STORAGE MEDIUM, SHUTTER APPARATUS, EXPOSURE APPARATUS, AND METHOD FOR MANUFACTURING ARTICLE

(71) Applicant: CANON KABUSHIKI KAISHA, Tokyo (JP)

(72) Inventor: Shunsuke Miyazaki, Saitama (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 17/820,763

(22) Filed: Aug. 18, 2022

(65) Prior Publication Data
US 2023/0072488 A1 Mar. 9, 2023

(30) Foreign Application Priority Data
Sep. 8, 2021 (JP) .................. 2021-146149

(51) Int. Cl.
H04N 23/73 (2023.01)
H04N 23/71 (2023.01)

(52) U.S. Cl.
CPC ............ H04N 23/73 (2023.01); H04N 23/71 (2023.01)

(58) Field of Classification Search
CPC .... H04N 23/73; H04N 23/71; G03F 7/70066; G03F 7/7055; G03F 7/7085; G03F 7/70975; G03F 7/70533; G03F 7/0002
See application file for complete search history.

(56) References Cited

U.S. PATENT DOCUMENTS

| | | | | |
|---|---|---|---|---|
| 6,585,430 B2 * | 7/2003 | Matsuyama | ............ | G03D 5/00 396/611 |
| 2004/0101299 A1 * | 5/2004 | Matsumoto | ............ | G03B 9/08 396/452 |
| 2005/0134700 A1 * | 6/2005 | Shiraishi | ............ | H04N 23/50 348/222.1 |
| 2007/0046808 A1 * | 3/2007 | Sagawa | ............ | H04N 23/634 348/E5.047 |
| 2011/0285816 A1 * | 11/2011 | Miyazaki | ............ | H04N 13/398 348/43 |
| 2013/0320589 A1 * | 12/2013 | Fujita | ............ | G03F 7/0002 264/293 |
| 2014/0005896 A1 * | 1/2014 | Hirota | ............ | B60K 11/085 701/49 |
| 2020/0249546 A1 * | 1/2020 | Suzuki | ............ | G03B 9/40 |
| 2020/0110333 A1 * | 4/2020 | Yoshida | ............ | B29C 33/424 |
| 2021/0096532 A1 * | 4/2021 | Sasaki | ............ | G06N 20/00 |
| 2022/0254050 A1 * | 8/2022 | Smirnov | ............ | G06T 7/70 |

FOREIGN PATENT DOCUMENTS

JP 2001-044110 A 2/2001

* cited by examiner

Primary Examiner — Twyler L Haskins
Assistant Examiner — Fayez A Bhuiyan
(74) Attorney, Agent, or Firm — Canon U.S.A., Inc. IP Division

(57) ABSTRACT

An abnormality detection apparatus for detecting an abnormal operation in a shutter apparatus configured to block light includes one or more memories, and one or more processors that cooperate with the one or more memories to detect the abnormal operation using an abnormality detection model that outputs determination data for detecting the abnormal operation in a case where information about measurement data on the shutter apparatus is input to the abnormality detection model.

17 Claims, 10 Drawing Sheets

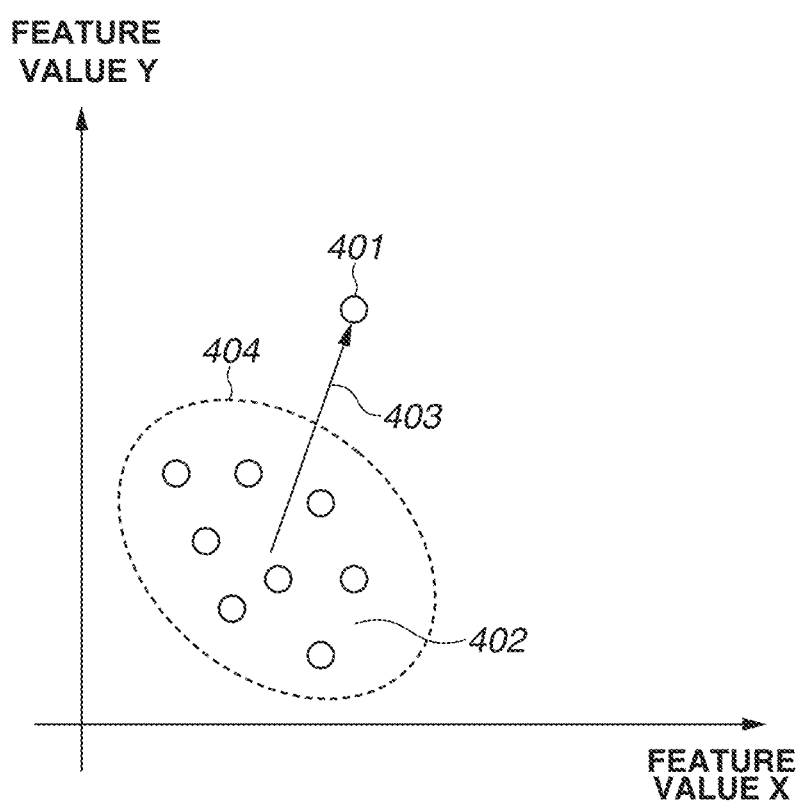

ABNORMALITY DETECTION APPARATUS, ABNORMALITY DETECTION METHOD, STORAGE MEDIUM, SHUTTER APPARATUS, EXPOSURE APPARATUS, AND METHOD FOR MANUFACTURING ARTICLE

BACKGROUND

Field of the Disclosure

The present disclosure relates to an abnormality detection apparatus, an abnormality detection method, a storage medium, a shutter apparatus, an exposure apparatus, and a method for manufacturing an article.

Description of the Related Art

A shutter apparatus is sometimes used to block light in manufacturing apparatuses such as an exposure apparatus that exposes a substrate via a reticle and a molding apparatus that brings a composition on a substrate into contact with a mold and irradiates the composition with light to harden the composition.

Japanese Patent Application Laid-Open No. 2001-44110 discusses an exposure apparatus that is used for projecting a reticle pattern onto a wafer and exposing the wafer in a semiconductor manufacturing process and that includes a shutter apparatus for controlling exposure amount during exposure.

According to Japanese Patent Application Laid-Open No. 2001-44110, in a case where a current deficit in a motor that drives the shutter apparatus is detected, a precautionary measure is performed based on the detection result.

However, abnormal operations that occur in shutter apparatuses are not limited to abnormal operations that are caused by a current deficit in a motor. For example, an abnormal operation that originates from a part such as a shutter blade or a motor shaft may occur. Further, for example, parts of a shutter apparatus deteriorate over time, and an abnormality may occur in the parts of the shutter apparatus. Further, for example, in a case where a shutter blade is deformed by external force or heat, a shutter may come into contact with other parts, and this can damage the shutter or the other parts. Thus, prompt detection of abnormal operations in a shutter apparatus is desired.

SUMMARY

Some embodiments of the present disclosure are directed to providing an abnormality detection apparatus, an abnormality detection method, and a storage medium for promptly detecting abnormal operations in a shutter apparatus.

According to an aspect of the present disclosure, an abnormality detection apparatus for detecting an abnormal operation in a shutter apparatus configured to block light includes one or more memories, and one or more processors that cooperate with the one or more memories to detect the abnormal operation using an abnormality detection model that outputs determination data for detecting the abnormal operation in a case where information about measurement data on the shutter apparatus is input to the abnormality detection model.

Further features of various embodiments will become apparent from the following description of exemplary embodiments with reference to the attached drawings.

BRIEF DESCRIPTION OF THE DRAWINGS

FIG. 4 is a diagram illustrating feature values and a Mahalanobis distance.

DESCRIPTION OF THE EMBODIMENTS

Figure 1A:
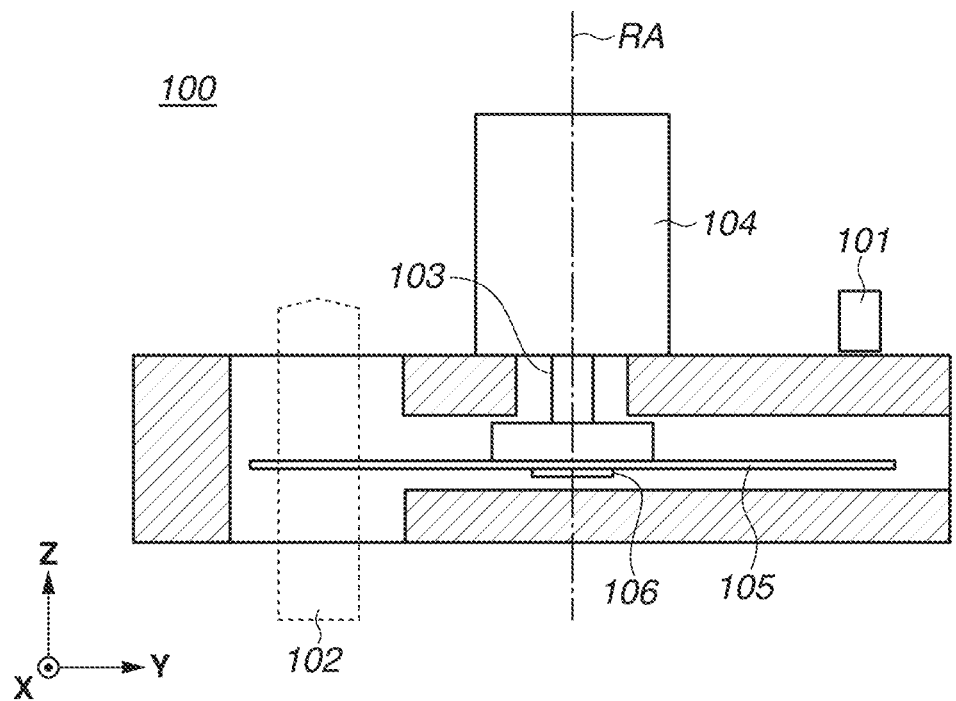
FIGS. 1A and 1B are diagrams illustrating a configuration of a shutter apparatus.

Various exemplary embodiments will be described in detail below with reference to the attached drawings. It should be noted that the following exemplary embodiments are not intended to limit every embodiment. Further, while a plurality of features according to the exemplary embodiments is described below, not all of the plurality of features are always essential to every embodiment. Further, the plurality of features can be combined as desired. Further, same or similar components are given the same reference numeral in the attached drawings, and redundant descriptions thereof are omitted.

Figure 1B:
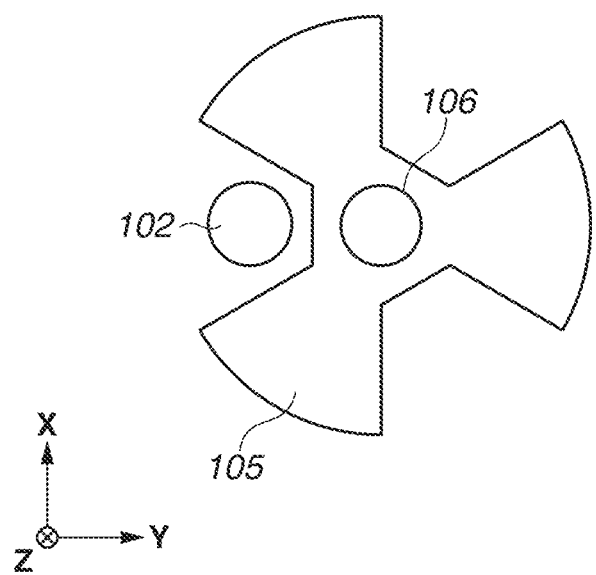

A first exemplary embodiment will be described below. FIGS. 1A and 1B are views illustrating a structure of a shutter apparatus. FIG. 1A is a cross-sectional view illustrating a shutter apparatus 100, and FIG. 1B is a plan view illustrating a shutter 105. The shutter apparatus 100 includes the shutter 105. Further, the shutter apparatus 100 opens or closes a light path of light 102 emitted from a light source (not illustrated) using the shutter 105 to block the light 102 or to allow the light 102 to pass through. The shutter 105 is made of, for example, a metal, such as aluminum or aluminum alloy, and the shutter 105 can be made of another material.

The shutter apparatus 100 includes the shutter 105 that blocks the light 102 and a driving mechanism for driving the shutter 105. The driving mechanism is, for example, a rotation mechanism 104 that rotates the shutter 105, which is attached to a shaft 103, about a rotation axis RA. The rotation mechanism 104 can be, for example, a motor that rotates the shaft 103 about the rotation axis RA. The rotation axis RA can be, for example, parallel to a direction of a main ray of the light 102 (a direction of an optical axis of an illumination optical system (not illustrated)) or can be tilted at an angle with respect to the direction of the main ray of the light 102. Hereinafter, the direction parallel to the direction of the main ray of the light 102 will be referred to as a Z-axis direction, and directions that are perpendicular to each other in a plane that is perpendicular to the Z-axis direction will be referred to as an X-axis direction and a Y-axis direction.

The shutter 105 is fixed to the shaft 103 of the rotation mechanism 104 with a jig 106. For example, the jig 106 includes a plurality of fixing parts (not illustrated), such as pins and bolts, and the plurality of fixing parts is fastened to thereby fix the shutter 105 to the shaft 103. Further, in the example illustrated in FIG. 1B, the shutter 105 includes three blades (light blocking portions). In this case, the rotation mechanism 104 performs driving (open driving) to open the light path of the light 102. Specifically, the shutter 105 in a state of blocking the light 102 is rotated by 60 degrees by the rotation mechanism 104. Further, the rotation mechanism 104 performs driving (close driving) to close the light path of the light 102. Specifically, the shutter 105 in a state of allowing the light 102 to pass through is rotated by 60 degrees by the rotation mechanism 104. In other words, the rotation mechanism 104 rotates the shutter 105 by 120 degrees to perform the open/close driving one time.

Further, the rotation mechanism 104 rotates the shutter 105 by 360 degrees to perform the open/close driving three times. The number of blades of the shutter 105 is not limited to three and can be any desired number. In that case, a rotation angle of the shutter 105 in the open/close driving is determined based on the number of light blocking portions of the shutter 105. As described above, the rotation mechanism 104 performs the open/close driving on the shutter 105 by rotating the shutter 105. Further, the rotation mechanism 104 performs the open/close driving three times to make one complete rotation of the shutter 105. In a case where the rotation mechanism 104 repeatedly performs the open/close driving on the shutter 105 at regular intervals, the shutter 105 is driven periodically. A period of the periodic driving of the shutter 105 is referred to as "driving period".

Further, the shutter apparatus 100 includes a sensor 101 for measuring physical quantities regarding the shutter apparatus 100. The sensor 101 can be, for example, a sensor that is provided to the shutter apparatus 100 and measures a vibration of the shutter apparatus 100. Specifically, the sensor 101 can be a sensor that measures at least one of a position, a velocity, and an acceleration of (a part of) the shutter apparatus 100. Further, the sensor 101 can be a sensor, such as an interferometer or an encoder, that contactlessly measures at least one of a position, a velocity, and an acceleration of the shutter apparatus 100. Further, the sensor 101 can be, for example, a sound sensor that measures a sound produced by the shutter apparatus 100. Further, the sensor 101 can be a torque sensor that measures a rotation torque generated by the rotation mechanism 104. Further, the sensor 101 can be a current sensor that measures a current consumption of the rotation mechanism 104. As described above, the sensor 101 measures physical quantities regarding the shutter apparatus 100, and measurement data on the measured physical quantities is acquired.

Further, the shutter apparatus 100 can include a driving mechanism for driving the shutter 105 in a predetermined direction in place of the rotation mechanism for driving the shutter 105 in the rotation direction. In such embodiments, the shutter 105 is not limited to the shape illustrated in FIG. 1B and can have any shape so that the light 102 is blocked as the shutter 105 is driven in the predetermined direction. The driving mechanism blocks the light 102 and allows the light 102 to pass through by, for example, reciprocally moving the shutter 105 along a predetermined direction. Specifically, in such embodiments, the driving mechanism periodically drives the shutter 105 with a predetermined driving period by reciprocally moving the shutter 105.

As described above, the shutter apparatus 100 periodically drives the shutter 105 with the predetermined driving period as described above, and a long-term operation may cause abrasions and deformations in the parts of the shutter apparatus 100, which can cause the shutter apparatus 100 to malfunction. Further, before the shutter apparatus 100 stops as a result of malfunctioning, a maintenance operation, such as parts replacement, is desirably performed to prevent the shutter apparatus 100 from malfunctioning.

Thus, the shutter apparatus 100 according to the present exemplary embodiment promptly detects abnormal operations in the shutter apparatus 100 so that a maintenance operation can be performed before the shutter apparatus 100 malfunctions.

Figure 2:
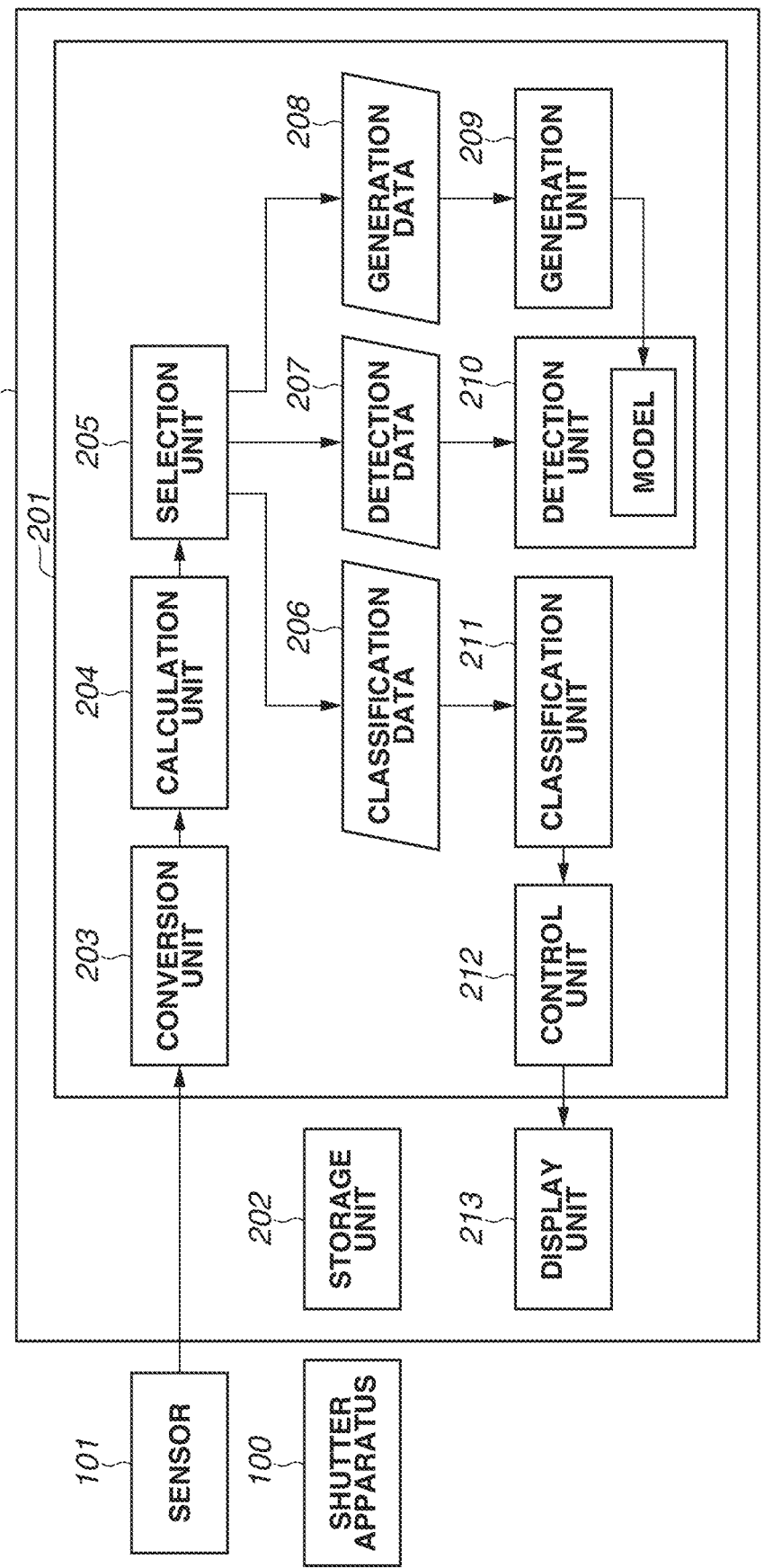
FIG. 2 is a diagram illustrating an abnormality detection apparatus for detecting abnormal operations in a shutter apparatus.

FIG. 2 is a diagram illustrating an abnormality detection apparatus that detects abnormal operations in a shutter apparatus. An abnormality detection apparatus 200 is a computer (information processing device). The abnormality detection apparatus 200 includes a processing unit 201 including a processor, such as a central processing unit (CPU), that performs computation for control based on a program. The abnormality detection apparatus 200 further includes a storage unit 202, such as a read-only memory (ROM), for storing control programs and static data and includes a random access memory (RAM) for use as a work area of the processing unit 201 and a temporary data storage area. Further, the abnormality detection apparatus 200 can include, as the storage unit 202, a magnetic storage device (e.g., hard disk drive (HDD)) capable of storing larger amounts of data compared to the ROM and the RAM. Further, the abnormality detection apparatus 200 can include, as the storage unit 202, a drive apparatus into which an external medium, such as a compact disk (CD), a digital versatile disk (DVD), or a memory card, is inserted for reading or writing data. According to the present exemplary embodiment, at least one of the ROM, the RAM, the magnetic storage device, and the drive device is used as the storage unit 202, and the storage unit 202 stores control programs, static data, work area of the processing unit 201, and temporary data. Further, the abnormality detection apparatus 200 can include a display unit 213, such as a cathode ray tube (CRT), a liquid crystal display, or a touch panel. The abnormality detection apparatus 200 can be provided either internally or externally to the shutter apparatus 100.

Figure 3:
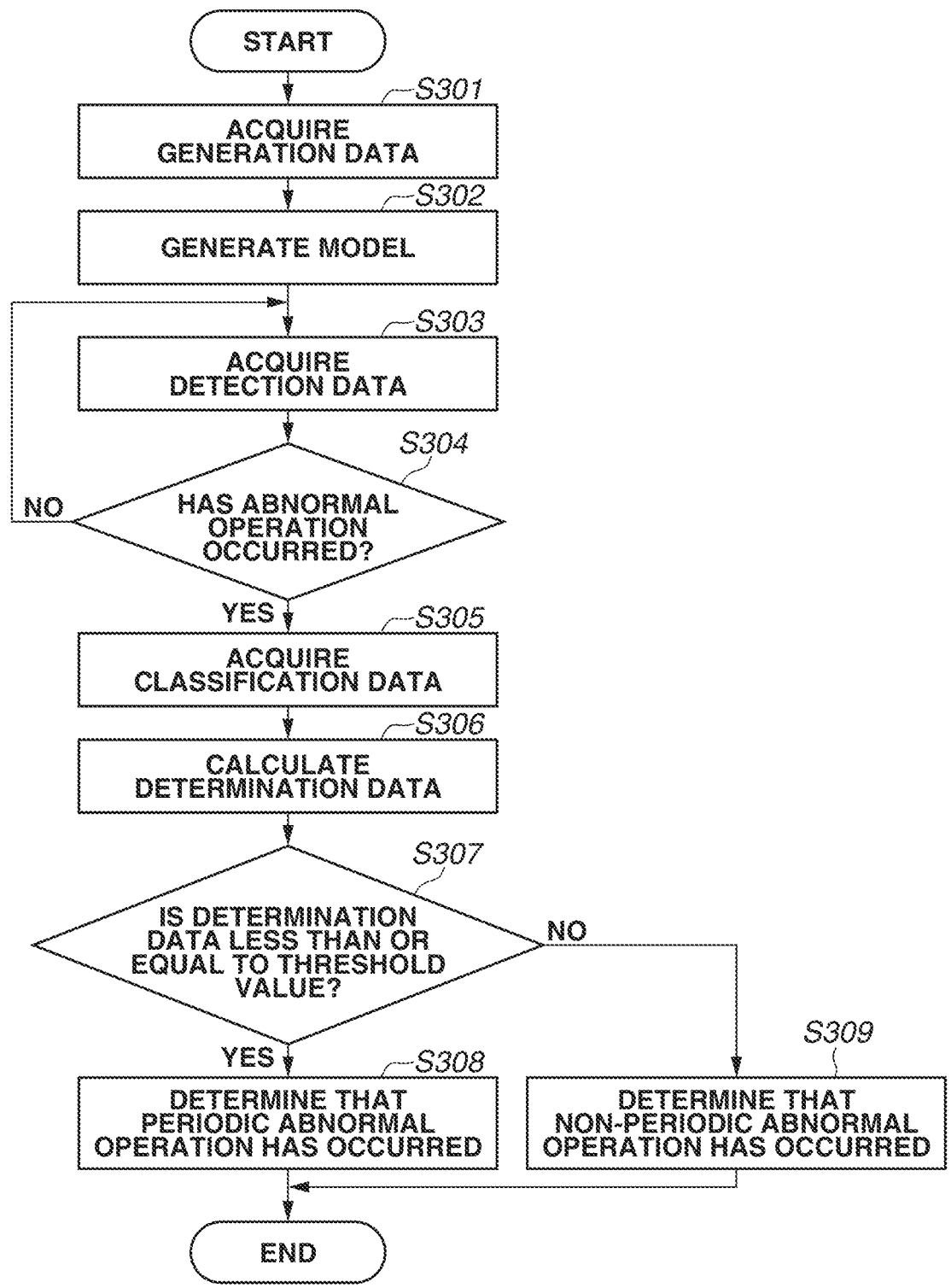
FIG. 3 is a flowchart illustrating an abnormality detection process according to a first exemplary embodiment.

Next, an abnormality detection process by the processing unit 201 will be described below with reference to FIGS. 2 and 3. FIG. 3 is a flowchart illustrating an abnormality detection process according to the present exemplary embodiment. The abnormality detection process illustrated in FIG. 3 is performed by components of the processing unit 201.

In step S301, the processing unit 201 acquires generation data 208 for generating a model (abnormality detection model) that outputs determination data for detecting an abnormal operation. First, the processing unit 201 acquires measurement data that is measured by the sensor 101 in a state where the shutter apparatus 100 operates normally. The measurement data measured by the sensor 101 includes time-series data on physical quantities regarding the shutter apparatus 100. Then, a conversion unit 203 converts the acquired measurement data from an analog signal to a digital signal (discrete signal).

Next, a calculation unit 204 calculates a feature value from the digital signal converted by the conversion unit 203. The feature value herein is calculated as, for example, a value of a center of gravity of a frequency spectrum waveform obtained by computing a discrete Fourier transform of the time-series digital signal. As described above, the feature value without the dimension of the measurement data is calculated as information about the measurement data measured by the sensor 101. A model generation processing mode for the calculated feature value is selected by a selection unit 205, and the feature value is stored as the generation data 208 in the storage unit 202. In a case where an abnormality detection processing mode or an abnormality classification processing mode described below is selected by the selection unit 205, the feature value is stored as data different from the generation data 208 in the storage unit 202.

A method for calculating a center of gravity of a frequency spectrum waveform as a feature value will be described below.

A center of gravity $G_x$ of a frequency component and a center of gravity $G_y$ of an amplitude component are calculated using formulas (1) and (2) below, where $G_x$ is the center of gravity of the frequency component of a frequency spectrum waveform, $G_y$ is the center of gravity of the amplitude component of the frequency spectrum waveform, $f_i$ is a frequency, $L_i$ is a frequency spectrum signal intensity, S is a sum of signal intensities of the entire frequency spectrum waveform, and n is a total number of data of the frequency spectrum waveform.

$$G_x = \sum_{i=1}^{n} \frac{f_i L_i}{S} \tag{1}$$

$$G_y = \sum_{i=1}^{n} \frac{L_i^2}{2S} \tag{2}$$

Further, a feature value to be calculated is not limited to the center of gravity of the frequency spectrum waveform. For example, a root mean square (RMS) value, a peak (maximum or minimum) signal intensity value, or a crest factor value, which is defined as a ratio between a peak value and an RMS value, of time-series data can be used as a feature value. Further, a result of a principal component analysis using multivariate time-series data consisting of a plurality of time-series data, such as vibration, torque, and control current, as input can be used as a feature value.

In step S302, a generation unit 209 generates an abnormality detection model using the generation data 208 stored in the storage unit 202.

During the operation of the shutter apparatus 100, normally a probability of an occurrence of an abnormal operation is extremely low, and the time during which an abnormal operation occurs is shorter than the time during which the shutter apparatus 100 operates normally. Thus, it is difficult to collect data that is (abnormal data) measured while an abnormal operation occurs in an amount that is sufficient to generate an abnormality detection model. Thus, according to the present exemplary embodiment, a model for detecting an abnormal operation is generated based on normal data. According to the present exemplary embodiment, the abnormality detection is performed on a normal data set using a Mahalanobis-Taguchi system (MT system), which is a well-known determination method that uses a combination of quality engineering and multivariate analysis.

FIG. 4 is a diagram illustrating feature values and a Mahalanobis distance. The MT system is a method for detecting abnormal data based on normal data. Input data 401 is data for the determination of whether the data is an abnormal operation, and a normal data set 402 is a normal feature value data set. A horizontal axis represents feature value X, and a vertical axis represents feature value Y. Each position is determined based on the feature value of the corresponding data. According to the MT system, a Mahalanobis distance 403 from a reference point (e.g., center) of the normal data set 402 to the input data 401 is calculated, and in a case where the calculated Mahalanobis distance 403 is outside a predefined acceptable range 404, the input data 401 is determined as an abnormal operation.

According to the MT system, a model that outputs the Mahalanobis distance 403 as determination data is used as an abnormality detection model. The Mahalanobis distance 403 is calculated using input data (x, y), which is an abnormal operation detection target, and a covariance matrix A of a normal data set (X, Y). A covariance $S_{xy}$ of the normal data set is calculated using formula (3).

$$S_{XY} = \frac{1}{n} \sum_{i=1}^{n} (X_i - \bar{X})(Y_i - \bar{Y}) \tag{3}$$

The covariance matrix A of the input data (x, y) is calculated using formula (4) using variances Sx, Sy, and Sxy of normal data.

$$A = \begin{pmatrix} S_{xx} & S_{xy} \\ S_{xy} & S_{yy} \end{pmatrix} \tag{4}$$

The Mahalanobis distance 403 of the input data (x, y) from the normal data set (X, Y) is calculated using formula (5), where MD is the Mahalanobis distance 403.

$$MD = \sqrt{(x - \bar{X} \quad y - \bar{Y}) A^{-1} \begin{pmatrix} x - \bar{X} \\ y - \bar{Y} \end{pmatrix}} \tag{5}$$

As described above, in step S302, the generation unit 209 generates formula (5), which outputs the Mahalanobis distance 403 using the input data (x, y) as input, as an abnormality detection model. According to the present exemplary embodiment, a feature value ($G_x$, $G_y$) is used as the input data (x, y).

In step S303, the processing unit 201 acquires detection data 207 for detecting an abnormal operation. The processing unit 201 acquires time-series data on physical quantities measured by the sensor 101 in a state where the shutter apparatus 100 is operating, and the processing unit 201 calculates a feature value. The time-series data acquisition and the feature value calculation in step S303 are similar to those in step S301, so that redundant detailed descriptions thereof are omitted. Further, an abnormality detection processing mode for the calculated feature value is selected by the selection unit 205, and the feature value is stored in the storage unit 202 as the detection data 207 for detecting an abnormal operation.

In step S304, a detection unit 210 determines whether an abnormal operation has occurred in the shutter apparatus 100. Specifically, the detection unit 210 determines whether the detection data 207 stored in the storage unit 202 is abnormal data using the abnormality detection model generated by the generation unit 209. The detection unit 210 inputs the detection data 207 to the abnormality detection model and acquires the Mahalanobis distance 403 output from the abnormality detection model. In a case where the Mahalanobis distance 403 is greater than or equal to a threshold value $MD_{th}$, which represents a boundary of the acceptable range 404 in FIG. 4, (in a case where formula (6) below is satisfied), the detection data 207 is determined as abnormal data.

$$MD_{th} \leq MD \tag{6}$$

An abnormality detection method is not limited to methods using the MT system, and the abnormality detection can be performed using, for example, the k-nearest neighbor algorithm, One-Class Support Vector Machine (One-Class SVM), or an autoencoder.

In step S304, in a case where the shutter apparatus 100 determines that an abnormal operation has occurred (YES in step S304), the processing proceeds to step S305. On the other hand, in a case where the shutter apparatus 100 does not determine that an abnormal operation has occurred (NO in step S304), the processing returns to step S303.

In step S305, the processing unit 201 acquires the time-series data on the physical quantities that are measured by the sensor 101 in the state where the shutter apparatus 100 is operating, and the processing unit 201 calculates a feature value.

The time-series data acquired in step S305 is divided into a plurality of time-series data for each driving period of the shutter apparatus 100, and a plurality of feature values corresponding to the plurality of time-series data is calculated. Further, the time-series data acquisition and the feature value calculation are similar to those in step S301, so that redundant detailed descriptions thereof are omitted. Further, an abnormality classification processing mode for the plurality of calculated feature values is selected by the selection unit 205, and the plurality of feature values is stored in the storage unit 202 as classification data 206 for classifying an abnormal operation.

In step S306, a classification unit 211 calculates determination data based on at least two feature values selected from the plurality of feature values of the classification data 206. The classification unit 211 can calculate, for example, a difference or ratio between two feature values as determination data. Further, the classification unit 211 selects, for example, a plurality of combinations of two feature values from the plurality of feature values. Then, the classification unit 211 calculates a difference or ratio between two feature values of each of the plurality of combinations and can calculate a statistical value, such as a maximum value, a minimum value, a mean value, or a median value of the calculated differences or ratios, as determination data.

According to the present exemplary embodiment, an abnormal operation that has occurred in the shutter apparatus 100 is classified focusing on the point that the shutter apparatus 100 is driven periodically with the predetermined driving period. An example of the abnormal operation in the shutter apparatus 100 is an abnormal operation that occurs as a result of the shutter 105 being deformed by heat or external force. In a case where the shutter 105 is deformed, the shutter 105 may come into contact with a part, such as a housing of the shutter apparatus 100, while the shutter 105 is driven. For example, in a case where the shutter 105 includes three blades as illustrated in FIG. 1B and one of the blades is deformed and comes into contact with a part of the shutter apparatus 100, one abnormal operation per three times of open/close driving (one-period driving) occurs in time-series data measured by the sensor 101.

Figure 5A:
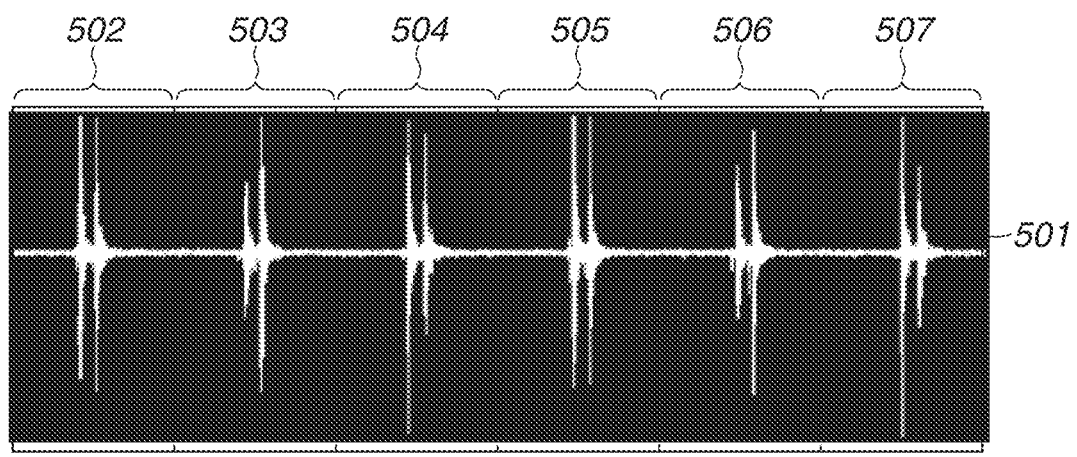
FIGS. 5A and 5B are diagrams illustrating time-series data measured by a sensor.
Figure 5B:
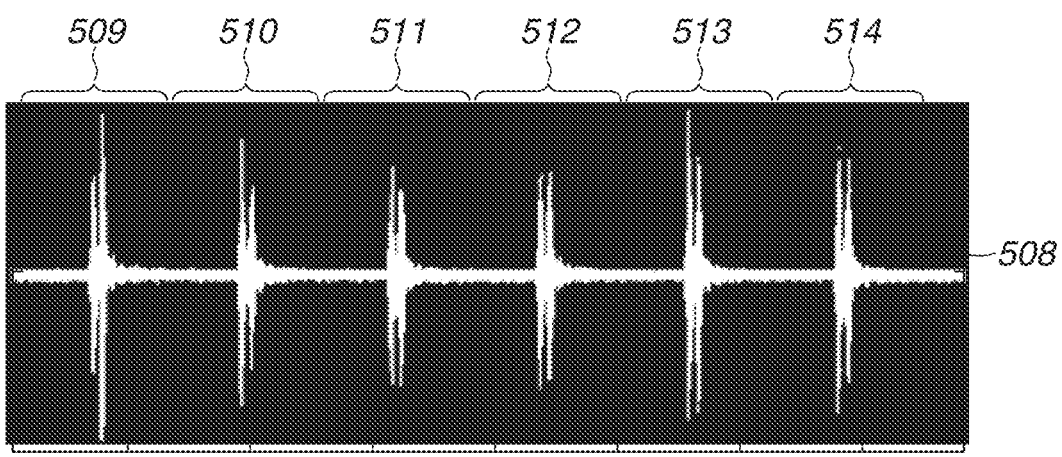

FIGS. 5A and 5B are diagrams illustrating time-series data measured by the sensor 101. FIG. 5A is a diagram illustrating time-series data 501 in a case where an abnormal operation occurs as a result that one blade of the shutter 105 is deformed and comes into contact with a part of the shutter apparatus 100. In the time-series data 501, time-series data 502 to time-series data 507 are time-series data at timings at which the open/close driving is performed on the shutter 105. In the example in FIG. 5A, an abnormality occurs in the time-series data 502 and the time-series data 505. Waveforms of the time-series data 502 and the time-series data 505 are similar to each other, and feature values calculated from the time-series data 502 and the time-series data 505 have a high correlation. In other words, in a case where an abnormal operation occurs as a result of a part of the shutter apparatus 100 coming into contact with the shutter 105 while the shutter 105 is driven, a periodic feature appears in a waveform of the time-series data 501 measured by the sensor 101.

Further, another example of the abnormal operation in the shutter apparatus 100 is an abnormal operation that occurs as a result of the force that fixes the shutter 105 to the shaft 103 decreasing as a result of a decrease in a fastening force of the fixing parts of the jig 106, and consequently the shutter 105 does not follow the rotation of the shaft 103 completely. In this case, the possibility that the shutter 105 immediately comes into contact with a part of the shutter apparatus 100 while the shutter 105 is driven is low.

FIG. 5B is a diagram illustrating time-series data 508 in a case where an abnormality occurs as a result that the force that fixes the shutter 105 to the shaft 103 decreases and the shutter 105 does not follow the rotation of the shaft 103 completely. In the time-series data 508, time-series data 509 to time-series data 514 are time-series data at timings at which the open/close driving is performed on the shutter 105. In the example in FIG. 5B, an abnormally occurs in the time-series data 509 to the time-series data 514. However, unlike the example in FIG. 5A, waveforms of the time-series data 509 to the time-series data 514 are not similar to each other, and feature values calculated from the time-series data 509 to the time-series data 514 have a low correlation. In other words, in a case where an abnormal operation occurs as a result of the force that fixes the shutter 105 to the shaft 103 decreasing while the shutter 105 is driven, no periodic features appear in a waveform of the time-series data 501 measured by the sensor 101.

Therefore, the difference or ratio between the feature value acquired from the time-series data 502 and the feature value acquired from the time-series data 505 is small whereas the difference or ratio between the feature value acquired from the time-series data 509 and the feature value acquired from the time-series data 502 is great. Specifically, an abnormal operation that occurs in the shutter apparatus 100 can be classified using the determination data calculated based on the plurality of feature values in the classification data 206.

Which feature values to select from the plurality of feature values in the classification data 206 is determined based on properties of the shutter apparatus 100. For example, in the example in FIG. 1B, since there are three blades (light blocking portions), feature values calculated from the time-series data corresponding to every three times of open/close driving (one-period driving), such as the time-series data 502 and the time-series data 505, are selected. In the example in FIG. 5A, the time-series data 501 obtained by performing the open/close driving six times (two-period rotation driving) is illustrated. In step S306, the classification unit 211 selects the combination of the time-series data 502 and the time-series data 505, the combination of the time-series data 503 and the time-series data 506, and the combination of the time-series data 504 and the time-series data 507. Then, the classification unit 211 calculates determination data based on feature values calculated from the combinations. Further, the classification unit 211 can calculate determination data as a plurality of data or can calculate determination data as a statistical value, such as a maximum value, a minimum value, a mean value, or a median value, of a plurality of data.

FIG. 3 will be described further below. In step S307, the classification unit 211 determines whether the determination data is less than or equal to a predefined threshold value. In a case where the classification unit 211 determines that the determination data is less than or equal to the predefined threshold value (YES in step S307), the processing proceeds to step S308. On the other hand, in a case where the classification unit 211 does not determine that the determination data is less than or equal to the predefined threshold value (NO in step S307), the processing proceeds to step S309.

In step S308, the classification unit 211 determines that a periodic abnormal operation has occurred in the shutter apparatus 100. Further, the classification unit 211 can display an error message indicating that a periodic abnormal operation has occurred on the display unit 213 via a control unit 212. Further, while the abnormal operation that occurs as a result of the shutter 105 coming into contact with a part of the shutter apparatus 100 is described above as a periodic abnormal operation, periodic abnormal operations are not limited to those described above. A periodic abnormal operation can be, for example, an abnormal operation that occurs as a result of a part that is driven other than the shutter 105 coming into contact with another part of the shutter apparatus 100.

Further, in a case where a periodic abnormal operation occurs in the shutter apparatus 100, there is a high possibility that a part that is driven, such as the shutter 105, comes into contact and causes an abnormal operation that leads to damage to the shutter apparatus 100. Thus, the control unit 212 can perform control to stop the operation of the shutter apparatus 100. This makes it possible to promptly perform maintenance on the shutter apparatus 100.

In step S309, the classification unit 211 determines that a non-periodic abnormal operation has occurred in the shutter apparatus 100. Further, the classification unit 211 can display an error message indicating that a non-periodic abnormal operation has occurred on the display unit 213 via the control unit 212. Further, while the abnormal operation that occurs as a result of a decrease in a force that fixes the shutter 105 to the shaft 103 is described above as a non-periodic abnormal operation, non-periodic abnormal operations are not limited to those described above. A non-periodic abnormal operation can be, for example, an abnormal operation that occurs as a result of a decrease in a force that fixes a part other than the shutter 105.

Further, in a case where a non-periodic abnormal operation occurs in the shutter apparatus 100, the possibility that a part that is driven, such as the shutter 105, comes into contact and causes an abnormal operation is low, and the possibility that the abnormal operation immediately leads to damage to the parts of the shutter apparatus 100 is low. Thus, the control unit 212 can perform control to continue the operation of the shutter apparatus 100. This increases an operation rate of the shutter apparatus 100.

Further, in a case where a non-periodic abnormal operation occurs in the shutter apparatus 100 and the control unit 212 performs control to continue the operation of the shutter apparatus 100, the control unit 212 can reduce the velocity of the shutter 105 driven by the driving mechanism. Further, in a case where a non-periodic abnormal operation occurs in the shutter apparatus 100 and the control unit 212 performs control to continue the operation of the shutter apparatus 100, the control unit 212 can reduce the frequency of driving the shutter 105 by the driving mechanism. This increases the operation rate while the possibility of damage to the parts of the shutter apparatus 100 is decreased.

As described above, with the shutter apparatus 100 according to the present exemplary embodiment, feature values are calculated from measured time-series data, and whether an abnormal operation occurs in the shutter apparatus 100 is determined using an abnormality detection model, so that abnormal operations are promptly detected. Further, determination data is calculated based on feature values calculated from divided time-series data, and an abnormal operation that occurs in the shutter apparatus 100 is classified by comparing the calculated determination data and a threshold value.

Next, a shutter apparatus according to a second exemplary embodiment will be described below. Points that are not described below are similar to those according to the first exemplary embodiment. According to the present exemplary embodiment, time-series data measured by a measurement unit is divided into a plurality of groups, and whether an abnormal operation occurs in the shutter apparatus is determined using an abnormality detection model generated for each divided group.

Figure 6:
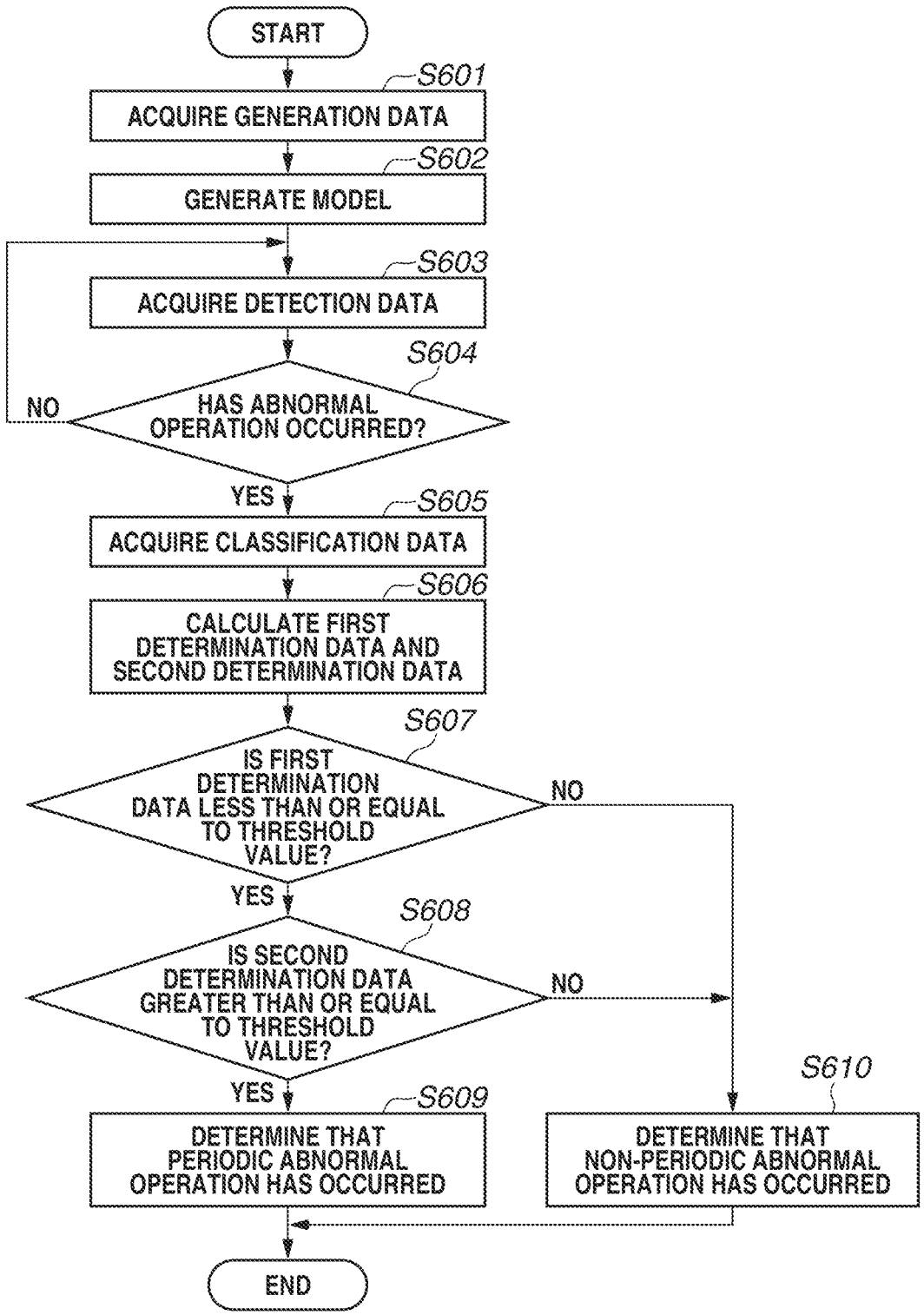
FIG. 6 is a flowchart illustrating an abnormality detection process according to a second exemplary embodiment.

FIG. 6 is a flowchart illustrating an abnormality detection process according to the present exemplary embodiment. The abnormality detection process illustrated in FIG. 6 is performed by the components of the processing unit 201.

In step S601, the processing unit 201 acquires the generation data 208 for generating an abnormality detection model for detecting an abnormal operation. First, the processing unit 201 acquires time-series data on physical quantities that are measured by the sensor 101 in a state where the shutter apparatus 100 operates normally. Next, the processing unit 201 divides the acquired time-series data by the timings of the open/close driving of the shutter 105 and divides the divided time-series data into a plurality of groups based on an order of the open/close driving of the shutter 105 in the driving period of the shutter apparatus 100.

Figure 7:
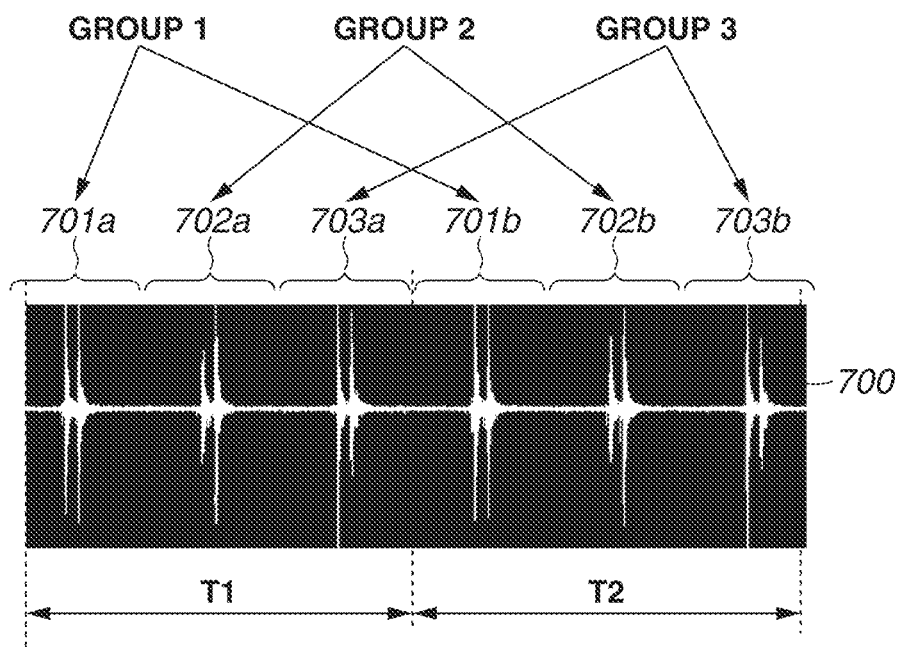
FIG. 7 is a diagram illustrating time-series data that is divided and grouped.

FIG. 7 is a diagram illustrating time-series data that is divided and grouped. In the example in FIG. 7, the shutter 105 includes three blades, and the open/close driving is performed three times per period. Further, in the example in FIG. 7, time-series data 700 corresponding to two periods is illustrated. Further, time-series data 701a is time-series data that is measured at the first open/close driving in a first period T1, time-series data 702a is time-series data that is measured at the second open/close driving in the first period T1, and time-series data 703a is time-series data that is measured at the third open/close driving in the first period T1. Further, time-series data 701b is time-series data that is measured at the first open/close driving in a second period T2, time-series data 702b is time-series data that is measured at the second open/close driving in the second period T2, and time-series data 703b is time-series data that is measured at the third open/close driving in the second period T2.

The processing unit 201 divides the acquired time-series data 700 into the time-series data 701a, the time-series data 702a, the time-series data 703a, the time-series data 701b, the time-series data 702b, and the time-series data 703b. Then, the processing unit 201 groups the time-series data 701a and the time-series data 701b as group 1, the time-series data 702a and the time-series data 702b as group 2, and the time-series data 703a and the time-series data 703b as group 3.

While the open/close driving of the shutter 105 is performed three times per period in the example in FIG. 7, the number of times the open/close driving is performed per period is not limited to three and can be any number. Further, while the time-series data corresponding to two periods is acquired in the example in FIG. 7, the number of periods is not limited to two, and time-series data corresponding to a desired number of periods can be acquired. Further, the number of groups of time-series data is not limited to three, and time-series data is divided into the number of groups corresponding to the number of times the open/close driving is performed on the shutter 105 per period.

Next, the conversion unit 203 converts the grouped time-series data from an analog signal to a digital signal, and the calculation unit 204 calculates a feature value for each group from the digital signals converted by the conversion unit 203. A feature value calculation method is similar to that according to the first exemplary embodiment, so that redundant detailed descriptions thereof are omitted.

Figure 8A:
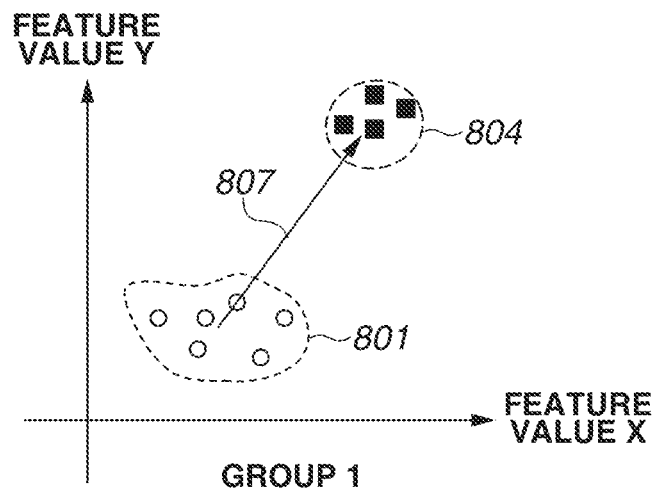
FIGS. 8A, 8B, and 8C are diagrams illustrating feature values and a Mahalanobis distance of a group.
Figure 8B:
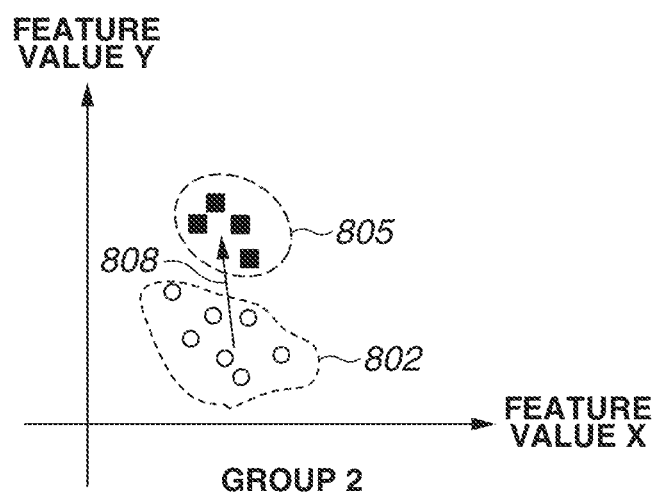
Figure 8C:
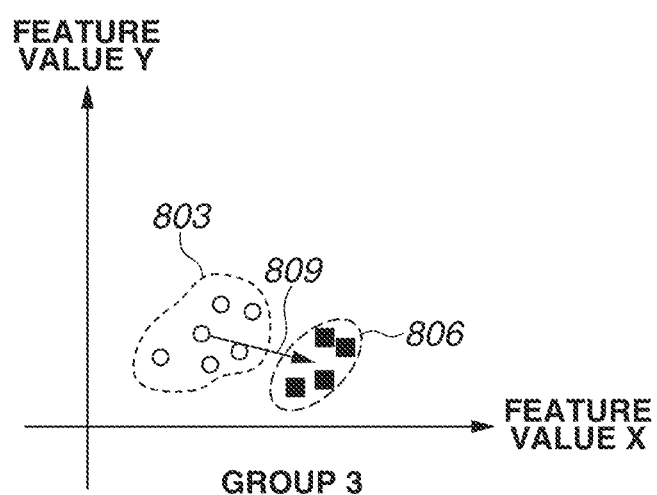

FIGS. 8A to 8C are diagrams illustrating feature values and a Mahalanobis distance for each group. In FIGS. 8A to 8C, a case where data is divided into three groups is illustrated. FIG. 8A illustrates feature values for group 1. FIG. 8B illustrates feature values for group 2. FIG. 8C illustrates feature values for group 3. Further, normal data sets 801 to 803 are normal feature value data sets that belong to groups 1 to 3. Further, a model generation processing mode is selected for the calculated and grouped feature values by the selection unit 205, and the feature values are stored as the generation data 208 by group in the storage unit 202.

FIG. 6 will be described further below. In step S602, the generation unit 209 generates an abnormality detection model for each group using the generation data 208 stored in the storage unit 202. A method for generating an abnormality detection model is similar to the method according to the first exemplary embodiment, so that redundant detailed descriptions thereof are omitted.

In step S603, the processing unit 201 acquires the detection data 207 for detecting an abnormal operation. First, the processing unit 201 acquires time-series data on physical quantities that are measured by the sensor 101 in a state where the shutter apparatus 100 operates. Next, the processing unit 201 divides the acquired time-series data by the timings of open/close driving of the shutter 105 and divides the divided time-series data into the plurality of groups based on the timings of the open/close driving of the shutter 105. The time-series data acquisition and the feature value calculation in step S603 are similar to those in step S601, so that redundant detailed descriptions thereof are omitted. Further, an abnormality detection processing mode is selected for the calculated and grouped feature values by the selection unit 205, and the feature values are stored as the detection data 207 by group in the storage unit 202.

In step S604, the detection unit 210 determines whether an abnormal operation has occurred in the shutter apparatus 100. Specifically, the detection unit 210 determines whether the detection data 207 stored in the storage unit 202 is abnormal data using the abnormality detection models generated by the generation unit 209. The detection unit 210 determines whether the detection data 207 stored for each group is abnormal data using the abnormality detection model corresponding to the group. Further, the detection unit 210 performs the determination of whether the detection data 207 is abnormal data for each of the plurality of groups, and in a case where at least one of the groups is determined as abnormal data, the detection unit 210 determines that the detection data 207 includes abnormal data. Further, an abnormality detection method is similar to the method according to the first exemplary embodiment except that the method is performed for each group, so that redundant detailed descriptions thereof are omitted.

In step S604, in a case where the detection data 207 is determined as abnormal data (YES in step S604), the processing proceeds to step S605, whereas in a case where the detection data 207 is not determined as abnormal data (NO in step S604), the processing returns to step S603.

In step S605, the processing unit 201 acquires time-series data on physical quantities that are measured by the sensor 101 in a state where the shutter apparatus 100 operates, and the processing unit 201 calculates feature values.

The time-series data acquisition and the feature value calculation are similar to those in step S601, so that redundant detailed descriptions thereof are omitted. Further, an abnormality classification processing mode is selected for the plurality of calculated feature values by the selection unit 205, and the plurality of feature values is stored as the classification data 206 for classifying an abnormal operation in the storage unit 202.

In step S606, the classification unit 211 calculates first determination data and second determination data based on the classification data 206.

A method for calculating first determination data and second determination data will be described below with reference to FIGS. 8A to 8C. In FIGS. 8A to 8C, abnormal data sets 804 to 806 are abnormal feature value data sets that respectively belong to groups 1 to 3. Further, Mahalanobis distances 807 to 809 are Mahalanobis distances of the abnormal data sets 804 to 806 from the normal data sets 801 to 803 of groups 1 to 3.

In a case where a periodic abnormal operation occurs, because pieces of time-series data that are grouped together have a common feature, a variance of abnormal data sets of grouped feature values is less than a predetermined threshold value. An example of a periodic abnormal operation is an abnormal operation that occurs as a result of one blade being deformed and coming into contact with a part of the shutter apparatus 100. Further, in a case where a periodic abnormal operation occurs, an abnormal operation occurs at the open/close driving at specific timings in one period, so that a Mahalanobis distance of the specific group is greater than Mahalanobis distances of the other groups. In the examples in FIGS. 8A to 8C, the Mahalanobis distance 807 of group 1 is greater than the Mahalanobis distances 808 and 809 of groups 2 and 3. This indicates that that an abnormality occurs in the feature values of group 1 and a periodic abnormal operation may have occurred in the shutter apparatus 100.

Thus, according to the present exemplary embodiment, the first determination data and the second determination data are calculated based on a variance of feature values calculated for each group and a Mahalanobis distance calculated for each group. First, a maximum value of the variances of the feature values of the abnormal data sets for the groups is calculated as the first determination data. Further, the second determination data is calculated as a quotient obtained by dividing a maximum value of the Mahalanobis distances for the groups by the sum of the Mahalanobis distances for the groups.

FIG. 6 will be described further below. In step S607, the classification unit 211 determines whether the first determination data is less than or equal to a predefined threshold value. In a case where the classification unit 211 determines that the first determination data is less than or equal to the predefined threshold value (YES in step S607), the processing proceeds to step S608. On the other hand, in a case where the classification unit 211 does not determine that the first determination data is less than or equal to the predefined threshold value (NO in step S607), the processing proceeds to step S610. A formula for determining the first determination data (the maximum value of the variances of the feature values of the abnormal data sets for the groups) is as expressed by formula (7) below, where max($V_{Gr}$) is the maximum value of the variances of the feature values for the groups, and $V_{th}$ is the threshold value.

$$V_{th} \geq \max(V_{Gr}) \qquad (7)$$

In step S608, the classification unit 211 determines whether the second determination data is greater than or equal to a predefined threshold value. In a case where the classification unit 211 determines that the second determination data is greater than or equal to the predefined threshold value (YES in step S608), the processing proceeds to step S609. On the other hand, in a case where the classification unit 211 does not determine that the second determination data is greater than or equal to the predefined threshold value (NO in step S608), the processing proceeds to step S610. A formula for determining the second determination data (the quotient obtained by dividing the maximum value of the Mahalanobis distances for the groups by the sum of the Mahalanobis distances for the groups) is expressed by formula (8) below, where $MD_1$ is the Mahalanobis distance for group 1, $MD_2$ is the Mahalanobis distance for group 2, $MD_3$ is the Mahalanobis distance for group 3, $MD_{max}$ is the maximum value of the Mahalanobis distances for the groups, and $ERR_{th}$ is the threshold value.

$$ERR_{th} \leq \frac{MD_{max}}{MD_1 + MD_2 + MD_3} \qquad (8)$$

In step S609, the classification unit 211 determines that a periodic abnormal operation has occurred in the shutter apparatus 100. Further, the classification unit 211 can display an error message indicating that a periodic abnormal operation has occurred on the display unit 213 via the control unit 212.

In step S610, the classification unit 211 determines that a non-periodic abnormal operation has occurred in the shutter apparatus 100. Further, the classification unit 211 can display an error message indicating that a non-periodic abnormal operation has occurred on the display unit 213 via the control unit 212.

As described above, with the shutter apparatus 100 according to the present exemplary embodiment, feature values are calculated from measured time-series data, and whether an abnormal operation has occurred in the shutter apparatus 100 is determined using an abnormality detection model, so that abnormal operations are promptly detected. Further, determination data is calculated based on feature values calculated for each group, and an abnormal operation that occurs in the shutter apparatus 100 is classified by comparing the calculated determination data and a threshold value.

Exemplary Embodiment of Exposure Apparatus

Figure 9:
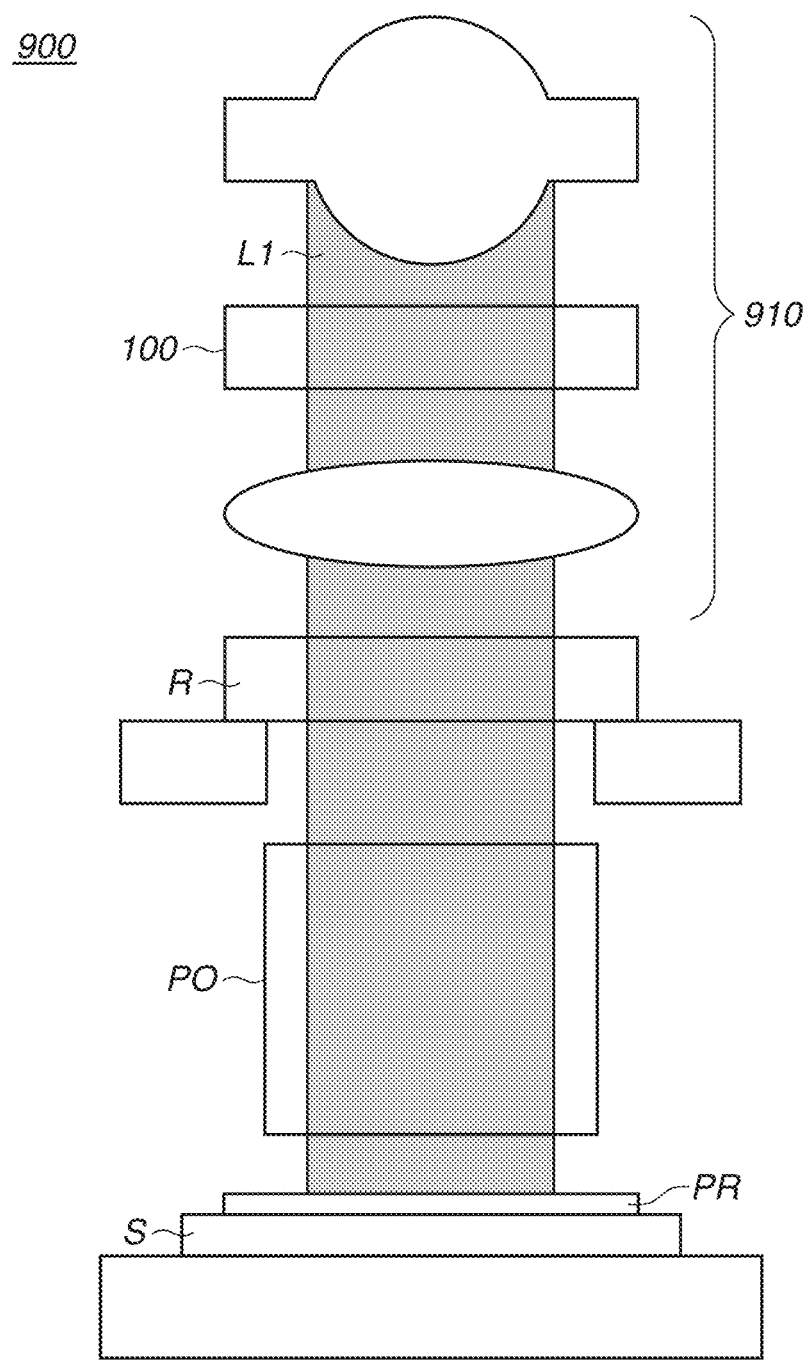
FIG. 9 is a view illustrating an exposure apparatus including a shutter apparatus therein.

FIG. 9 illustrates an example of an exposure apparatus 900 including the shutter apparatus 100 according to the first and second exemplary embodiments. The exposure apparatus 900 exposes a photosensitive material PR applied to a substrate S by illuminating the substrate S with exposure light L1 via a reticle R and a projection optical system PO. The exposure apparatus 900 includes an illumination optical system 910 for illuminating the reticle R, and the illumination optical system 910 includes the shutter apparatus 100.

The exposure apparatus 900 can be used in manufacturing articles, such as semiconductor devices. A method for manufacturing an article according to an exemplary embodiment includes applying a photosensitive material to the substrate S, exposing the substrate S having undergone the application using the exposure apparatus 900, developing the photosensitive material on the substrate S having undergone the exposure, and processing the substrate S having undergone the development. Examples of the processing are ion injecting and etching. The method for manufacturing an article manufactures an article from the substrate S through the foregoing process.

Exemplary Embodiment of Molding Apparatus

Figure 10:
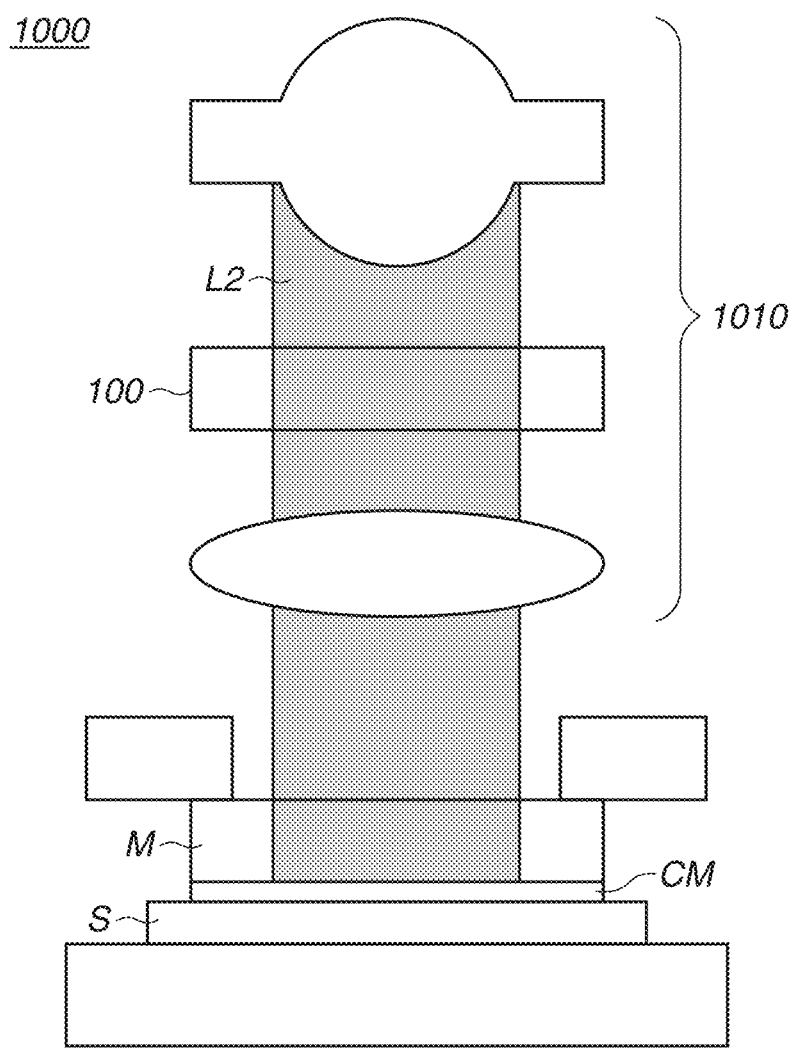
FIG. 10 is a view illustrating a molding apparatus including a shutter apparatus therein.

FIG. 10 illustrates an example of a molding apparatus 1000 including the shutter apparatus 100 according to the first and second exemplary embodiments. The molding apparatus 1000 molds a composition CM on a substrate S by bringing a mold M into contact with the composition CM on the substrate S and hardening the composition CM by illuminating the composition CM with light L2. The molding apparatus 1000 includes an optical system 1010 for illuminating the composition CM with the light L2, and the optical system 1010 includes the shutter apparatus 100. The molding apparatus 1000 can be, for example, an imprinting apparatus that forms a pattern consisting of the composition CM on the substrate S or a flattening apparatus that forms a flattened layer consisting of the composition CM on the substrate S.

The molding apparatus 1000 can be used in manufacturing an article, such as a semiconductor device. A method for manufacturing an article according to an exemplary embodiment includes molding the composition CM on the substrate S using the molding apparatus 1000 and processing the substrate S having undergone the foregoing process to manufacture an article from the substrate S.

The present disclosure provides an abnormality detection apparatus, an abnormality detection method, and a storage medium for promptly detecting abnormal operations in a shutter apparatus.

Other Embodiments

Some embodiment(s) of the present disclosure can also be realized by a computer of a system or apparatus that reads out and executes computer-executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer-executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer-executable instructions. The computer-executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)?), a flash memory device, a memory card, and the like.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

Further, as noted above, the first and second exemplary embodiments can be performed not only singly but also in combination.

This application claims priority to Japanese Patent Application No. 2021-146149, which was filed on Sep. 8, 2021 and which is hereby incorporated by reference herein in its entirety.

What is claimed is:

1. An abnormality detection apparatus for detecting an abnormality in a shutter apparatus configured to block light, the abnormality detection apparatus comprising:
   one or more memories; and
   one or more processors that cooperate with the one or more memories to:
   detect the abnormality using an abnormality detection model that outputs determination data for detecting the abnormality by inputting information to the abnormality detection model,
   wherein the information includes a feature value calculated from time-series data of a physical quantity regarding the shutter apparatus, and
   wherein the feature value includes a center of gravity that is calculated from a waveform of the time-series data.

2. The abnormality detection apparatus according to claim 1, wherein the physical quantity includes at least one of a position of the shutter apparatus, a velocity of the shutter apparatus, and an acceleration of the shutter apparatus.

3. The abnormality detection apparatus according to claim 1, wherein the physical quantity includes a sound produced by the shutter apparatus.

4. The abnormality detection apparatus according to claim 1, wherein the physical quantity includes a torque generated by a driving mechanism that drives a shutter of the shutter apparatus.

5. The abnormality detection apparatus according to claim 1, wherein the physical quantity includes a current consumption of a driving mechanism that drives a shutter of the shutter apparatus.

6. The abnormality detection apparatus according to claim 1, wherein the abnormality detection model is generated based on measurement data that is measured in a state where the shutter apparatus operates normally.

7. The abnormality detection apparatus according to claim 1, wherein the determination data includes a Mahalanobis distance calculated based on the feature value.

8. An abnormality detection apparatus for detecting an abnormality in a shutter apparatus configured to block light, the abnormality detection apparatus comprising:
   one or more memories; and
   one or more processors that cooperate with the one or more memories to:
   detect the abnormality using an abnormality detection model that outputs determination data for detecting the abnormality by inputting information to the abnormality detection model, wherein the information includes a feature value calculated from time-series data of a physical quantity regarding the shutter apparatus; and
   determine whether the detected abnormality is a periodic abnormality based on the time-series data of the physical quantity regarding the shutter apparatus and is divided based on a timing at which the shutter apparatus drives a shutter.

9. The abnormality detection apparatus according to claim 8, wherein the one or more processors further cooperate with the one or more memories to control an operation of the shutter apparatus,
   wherein the one or more processors further cooperate with the one or more memories to stop the operation of the shutter apparatus in a case where the abnormality is determined as the periodic abnormality.

10. The abnormality detection apparatus according to claim 9, wherein in a case where the abnormality is classified as a non-periodic abnormality, the one or more processors further cooperate with the one or more memories to reduce a velocity at which the shutter of the shutter apparatus is driven or a frequency at which the shutter is driven, and the one or more processors further cooperate with the one or more memories to continue the operation of the shutter apparatus.

11. An abnormality detection method for detecting an abnormality in a shutter apparatus configured to block light, the method comprising:
   detecting the abnormality using an abnormality detection model that outputs determination data for detecting the abnormality by inputting information to the abnormality detection model,
   wherein the information includes a feature value calculated from time-series data of a physical quantity regarding the shutter apparatus, and
   wherein the feature value includes a center of gravity that is calculated from a waveform of the time-series data.

12. A non-transitory computer-readable storage medium that stores a program for causing a computer to execute an abnormality detection method for detecting an abnormality in a shutter apparatus configured to block light, the abnormality detection method comprising:
   detecting the abnormality using an abnormality detection model that outputs determination data for detecting the abnormality by inputting information to the abnormality detection model,
   wherein the information includes a feature value calculated from time-series data of a physical quantity regarding the shutter apparatus, and
   wherein the feature value includes a center of gravity that is calculated from a waveform of the time-series data.

13. A shutter apparatus for blocking light, the shutter apparatus comprising:
   one or more memories; and
   one or more processors that cooperate with the one or more memories to:
   detect an abnormality in the shutter apparatus using an abnormality detection model that outputs determination data for detecting the abnormality by inputting information to the abnormality detection model,
   wherein the information includes a feature value calculated from time-series data of a physical quantity regarding the shutter apparatus, and
   wherein the feature value includes a center of gravity that is calculated from a waveform of the time-series data.

14. An exposure apparatus for exposing a substrate by illuminating the substrate with light, the exposure apparatus comprising:
- a shutter apparatus configured to block the light; and
- an abnormality detection apparatus configured to detect an abnormality in the shutter apparatus,
- wherein the abnormality detection apparatus includes:
- one or more memories; and
- one or more processors that cooperate with the one or more memories to:
- detect the abnormality using an abnormality detection model that outputs determination data for detecting the abnormality by inputting information to the abnormality detection model,
- wherein the information includes a feature value calculated from time-series data of a physical quantity regarding the shutter apparatus, and
- wherein the feature value includes a center of gravity that is calculated from a waveform of the time-series data.

15. A method for manufacturing an article, the method comprising:
- exposing the substrate using the exposure apparatus according to claim 14;
- developing the exposed substrate; and
- processing the developed substrate,
- wherein the article is manufactured from the processed substrate.

16. A molding apparatus for molding a composition on a substrate by bringing a mold into contact with the composition and illuminating the composition with light, the molding apparatus comprising:
- a shutter apparatus configured to block the light; and
- an abnormality detection apparatus configured to detect an abnormality in the shutter apparatus,
- wherein the abnormality detection apparatus includes
- one or more memories; and
- one or more processors that cooperate with the one or more memories to:
- detect the abnormality using an abnormality detection model that outputs determination data for detecting the abnormality by inputting information to the abnormality detection model,
- wherein the information includes a feature value calculated from time-series data of a physical quantity regarding the shutter apparatus, and
- wherein the feature value includes a center of gravity that is calculated from a waveform of the time-series data.

17. A method for manufacturing an article, the method comprising:
- molding the composition on the substrate using the molding apparatus according to claim 16; and
- processing the substrate on which the composition is molded,
- wherein the article is manufactured from the processed substrate.

* * * * *